US006842192B1

(12) United States Patent
Suzuki et al.

(10) Patent No.: US 6,842,192 B1
(45) Date of Patent: Jan. 11, 2005

(54) SOLID STATE IMAGE PICKUP DEVICE HAVING AN AMPLIFIER FOR EACH VERTICAL SIGNAL LINE AND DRIVING METHOD THEREFOR

(75) Inventors: Ryoji Suzuki, Kanagawa (JP); Kazuya Yonemoto, Tokyo (JP); Takahisa Ueno, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/159,569

(22) Filed: Sep. 24, 1998

(30) Foreign Application Priority Data

Sep. 26, 1997 (JP) ............................................ P9-261207

(51) Int. Cl.[7] ........................... H04N 3/14; H04N 5/335
(52) U.S. Cl. ...................................................... 348/308
(58) Field of Search ................................ 348/300, 308, 348/303, 304, 302, 305

(56) References Cited

U.S. PATENT DOCUMENTS

| | | | |
|---|---|---|---|
| 4,041,519 A | | 8/1977 | Melen |
| 4,242,706 A | * | 12/1980 | McCormack et al. ........ 348/306 |
| 4,547,806 A | * | 10/1985 | Herbst et al. ................ 348/300 |
| 4,609,824 A | * | 9/1986 | Munier et al. ............... 348/164 |
| 4,621,291 A | * | 11/1986 | Takemoto et al. ........... 348/303 |
| 4,628,364 A | * | 12/1986 | Koch .......................... 348/304 |
| 4,679,068 A | * | 7/1987 | Lillquist et al. ............. 348/164 |
| 5,001,359 A | * | 3/1991 | Hashimoto et al. .......... 348/241 |
| 5,345,266 A | | 9/1994 | Denyer |
| 5,543,838 A | * | 8/1996 | Hosier et al. ................ 348/303 |
| 5,818,070 A | * | 10/1998 | Yamazaki et al. ........... 257/270 |
| 5,831,258 A | * | 11/1998 | Street .......................... 348/308 |
| 5,898,168 A | * | 4/1999 | Gowda et al. ............... 348/311 |
| 5,973,311 A | * | 10/1999 | Sauer et al. ................. 348/302 |
| 5,978,025 A | * | 11/1999 | Tomasini et al. ............ 348/308 |
| 6,037,577 A | * | 3/2000 | Tanaka et al. ............... 348/302 |
| 6,320,617 B1 | * | 11/2001 | Gee et al. .................... 348/302 |
| 6,320,618 B1 | * | 11/2001 | Aoyama ...................... 348/335 |
| 6,528,852 B2 | * | 3/2003 | Takemura .................... 257/350 |
| 6,680,223 B1 | * | 1/2004 | Yamazaki et al. ........... 438/149 |

FOREIGN PATENT DOCUMENTS

| | | | | |
|---|---|---|---|---|
| FR | 2 736 782 | | 1/1997 | |
| JP | 62104074 A | * | 5/1987 | ........... H01L/27/14 |
| JP | 10248034 A1 | * | 9/1998 | |
| WO | WO 97/05657 | * | 2/1997 | ......... H01L/27/146 |

OTHER PUBLICATIONS

Ozaki, Toshifumi et al. "A Low–Noise Line–Amplified MOS Imaging Devices." IEEE Transactions on Electron Devices, vol. 38, No. 5, May 1991. 969–975.*

* cited by examiner

*Primary Examiner*—Wendy R. Garber
*Assistant Examiner*—Jason Whipkey
(74) *Attorney, Agent, or Firm*—Sonnenschein, Nath & Rosenthal LLP

(57) ABSTRACT

According to a solid-state image pickup device and a driving method thereof in which unit pixels, each comprising a photodiode, a selection MOS transistor and a read-out MOS transistor, are two-dimensionally disposed in a matrix form, and each vertical signal line is connected to a column amplifier. The vertical signal line is first reset by a reset MOS transistor, and then a pixel signal is read out from the photodiode to the vertical signal line to successively output the reset level and the signal level to a horizontal signal line through the same route (the column amplifier, the horizontal selection MOS transistor, etc.), and then the difference between the reset level and the signal level is calculated by a CDS circuit.

13 Claims, 13 Drawing Sheets

PERIOD a

PERIOD b

PERIOD c

SOLID STATE IMAGE PICKUP DEVICE HAVING AN AMPLIFIER FOR EACH VERTICAL SIGNAL LINE AND DRIVING METHOD THEREFOR

BACKGROUND OF THE INVENTION

The present invention relates to a solid-state image pickup device and a driving method thereof, and particularly to a solid-state image pickup device in which an amplifying means (column amplifier) is connected to each of vertical signal lines, and a driving method for removing noises thereof.

Figure 1:
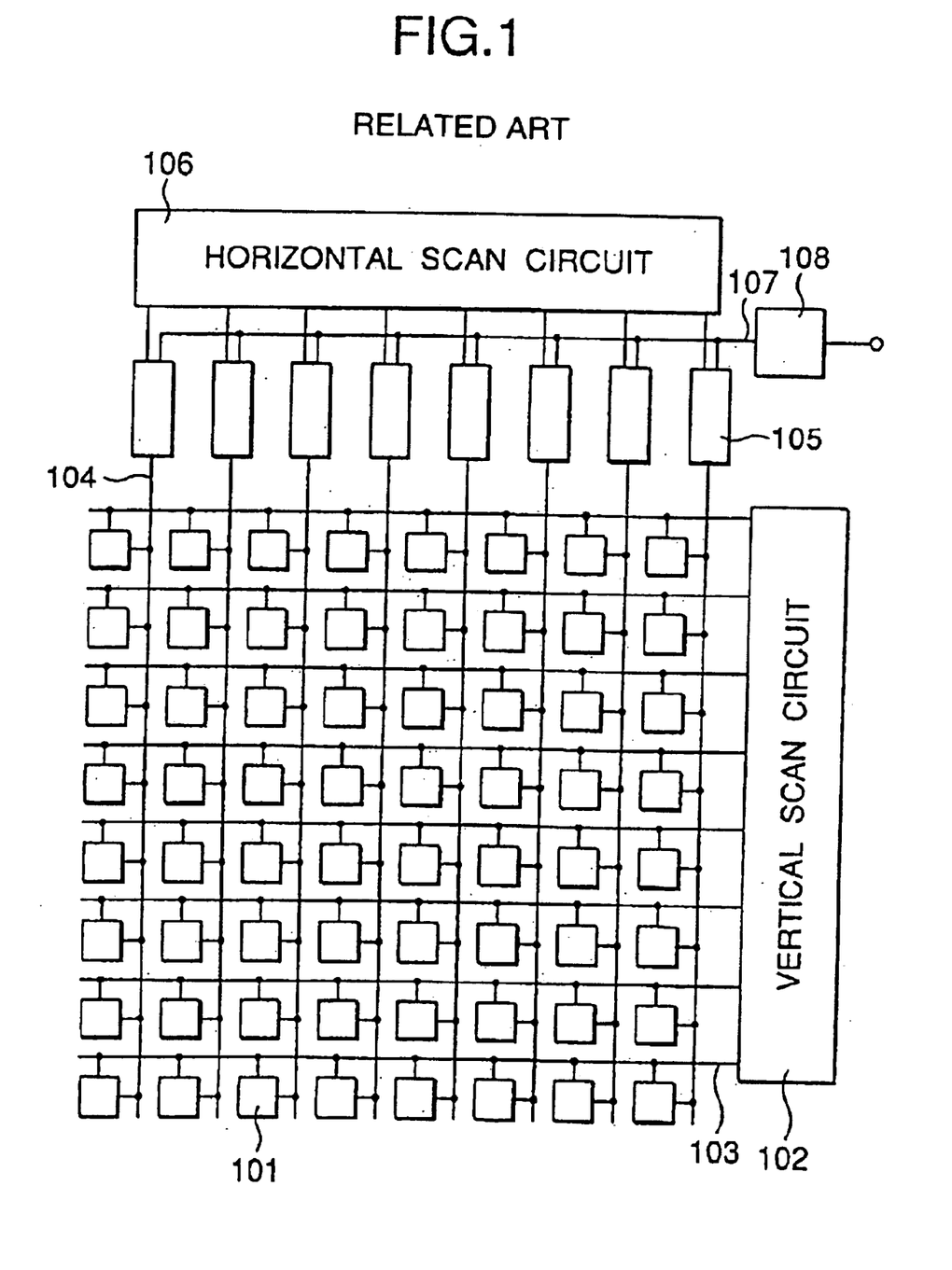
FIG. 1 is a circuit construction diagram showing a conventional solid-state image pickup device.

FIG. 1 shows one of conventional solid-state image pickup devices as disclosed in U.S. Pat. No. 5,345,266, for example. This solid-state image pickup device has such a basic construction that unit pixels 101 are two-dimensionally arranged in a matrix form and line selection is performed through vertical selection lines 103 by a vertical scan circuit 102, and also it is further constructed so that a column amplifier 105 is connected to each vertical signal line 104, a pixel signal of each unit pixel 101 is accumulated in the column amplifier 105 on a line basis, and column selection is performed by a horizontal scan circuit 106 to output the pixel signal thus accumulated through a horizontal scan signal line 107 and a sense amplifier 108.

In the conventional solid-state image pickup device thus constructed, however, the dispersion of Vth (threshold value) of every pixel of an MOS transistor constituting each unit pixel 101 is directly superposed on the output signal of the image pickup device. Since the Vth dispersion has a fixed value every pixel, a fixed pattern noise (FPN; fixed pattern noise) appears on the screen.

In order to suppress the fixed pattern noise, it has been hitherto needed that a noise removing circuit using a frame memory is provided to the outside of the device in order to store one of the output signal (noise component) under the dark condition and the output signal (picture component) under the light condition into the frame memory every pixel in advance, and the subtraction between the signal thus stored and the other pixel signal is performed to remove the noise component due to the Vth dispersion. Accordingly, a camera system must be designed in a larger size by the amount corresponding to the external mount of the noise removing circuit using the frame memory.

SUMMARY OF THE INVENTION

The present invention has been implemented in view of the above problem, and has an object to provide a solid-state image pickup device which can suppress a fixed pattern noise in the device, and a driving method to remove the noise.

A solid-state image pickup device according to the present invention includes: a pixel portion having unit pixels arranged two-dimentionally in a matrix form, the unit pixel including a photoelectrically transducing element for photoelectrically transducing incident light and stocking signal charge obtained by the photoelectrically transducing element, a selection switch for selecting a pixel and a read-out switch for reading out the signal charge from the photoelectrically transducing element to a vertical signal line; plural amplifying means each of which is connected to each vertical signal line and converts the signal charge read out to the vertical signal line to an electrical signal; and plural reset means for resetting each of the vertical signal lines.

Further, a driving method according to the present invention is characterized in that in the solid-state image pickup device thus constructed, the vertical signal line is first reset and then a pixel signal is read out from the photoelectrically transducing element to the vertical signal line to successively output the reset level and the signal level through the same route, and thereafter the difference between the reset level and the signal level is calculated.

In each unit pixel of the solid-state image pickup device thus constructed, there are a selection switch and a read-out switch. Accordingly, the pixel signal can be read out for every pixel. Therefore, the vertical signal line is first reset, and then each pixel signal is read out to the vertical signal line, whereby the reset level and the signal level are obtained in this order pixel by pixel. Further, by calculating the difference between the reset level and the signal level, the noise component due to the dispersion of the pixel characteristic can be cancelled. In addition, the reset level and the signal level are output through the same route, so that any stripe-shaped noise component having correlation in the vertical direction does not occur in principle.

DETAILED DESCRIPTION OF THE PREFERRED EMBODIMENTS

Preferred embodiments according to the present invention will be described hereunder with reference to the accompanying drawings.

Figure 2:
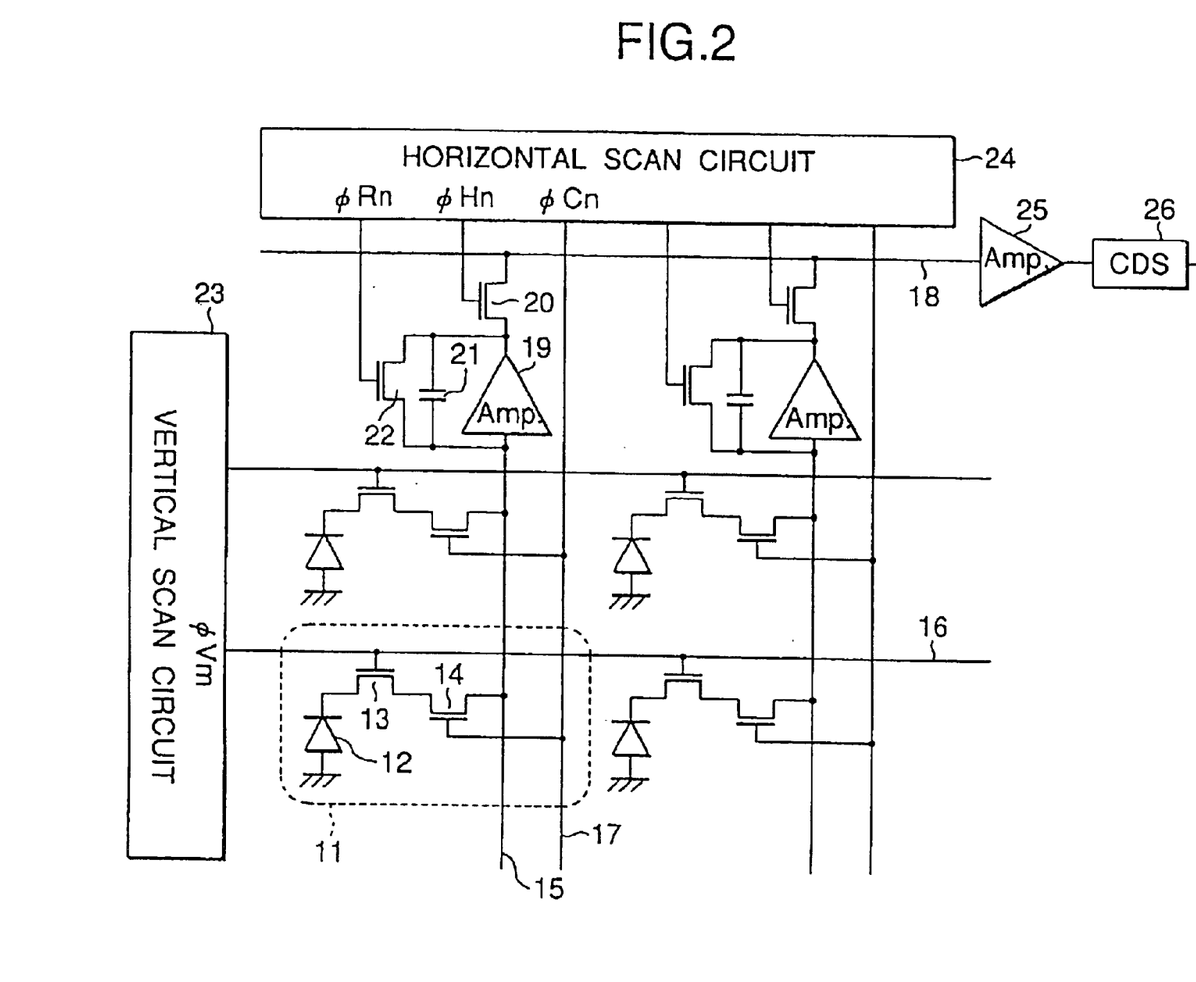
FIG. 2 is a schematic diagram showing a first embodiment of a solid-state image pickup device according to the present invention.

FIG. 2 is a diagram showing the construction of a first embodiment of a solid-state image pickup device according to the present invention.

In FIG. 2, an area surrounded by a broken line corresponds to a unit pixel 11. The unit pixel 11 comprises a photodiode (PD) 12 serving as a photoelectrically transducing element for transducing an incident light signal to an electrical signal (signal charge), a selection MOS transistor 13 serving as a selection switch for selecting a pixel (i.e. when it is turned on, the pixel containing the MOS transistor 13 concerned is selected), and a read-out MOS transistor 14 serving as a read-out switch for reading out the signal charge from the photodiode 12 (i.e. when it is turned on, the signal charge induced in the photodiode 12 is read out through the read-out MOS transistor 14). Plural unit pixels 11 having the above structure are arranged two-dimensionally in a matrix form.

In each unit pixel 11, the photodiode 12 has a function of transducing incident light to signal charge (i.e. performing photoelectrically transducing operation) and accumulating the signal charge thus obtained, that is, it serves both as a photoelectric transducer and as a charge accumulator. The selection MOS transistor 13 and the read-out MOS transistor 14 are connected to each other in series between the cathode electrode of the photodiode 12 and a vertical signal line 15. The gate electrode of the selection MOS transistor 13 is connected to a vertical selection line 16, and the gate electrode of the read-out MOS transistor 14 is connected to a read-out pulse line 17.

A column amplifier 19 serving as amplifying means for converting the signal charge read out to the vertical signal line 15 to a voltage signal, and a horizontal selection MOS transistor 20 for selectively outputting the output voltage of the column amplifier 19 to a horizontal signal line 18 are connected to each other in series between the end portion of the vertical signal line 15 and the horizontal signal line 18. The column amplifier 19 may be designed so as to convert signal charge to signal current. A capacitor 21 and a reset MOS transistor 22 serving as reset means for resetting the vertical signal line 15 are connected in parallel to the column amplifier 19.

Further, a vertical scan circuit 23 for line selection and a horizontal scan circuit 24 for column selection are provided. Each of these scan circuits 23, 24 comprises a shift register, for example. A vertical scan pulse φVm output from the vertical scan circuit 23 is applied to the vertical selection line 16, a read-out pulse φCn output from the horizontal scan circuit 24 is applied to the read-out pulse line 17, a horizontal scan pulse φHn is applied to the gate electrode of the horizontal selection MOS transistor 20, and a reset pulse φRn is applied to the gate electrode of the reset MOS transistor 22.

For example, a correlated double sampling circuit (hereinafter referred to as "CDS circuit") 26 is provided as a differential circuit through a horizontal output amplifier 25 at the output terminal side of the horizontal signal line 18. The CDS circuit 26 is provided to calculate the difference between the reset level and the signal level which are successively supplied through the horizontal signal line 18 from each of the unit pixels 11, and it has an advantage that the circuit construction thereof is simple as the differential circuit. The specific circuit construction of the CDS circuit 26 will be described in detail later.

Next, the operation of the solid-state image pickup device according to the first embodiment of the present invention will be described with reference to a potential diagram of FIG. 4 by using a timing chart of FIG. 3. As is apparent from FIG. 4, the photodiode 12 is designed in a HAD (hole accumulation diode) sensor structure in which a hole accumulation structure of a $p^+$ layer is added to the surface side of an np diode. Further, each gate electrode 13a, 14a of the selection MOS transistor 13 and the read-out MOS transistor 14 has a double gate structure comprising a one-layer gate electrode. Use of the double gate structure provides an advantage that the area can be reduced.

First, during a time period a when the vertical scan pulse φVm of m-th line is in "L" level, the signal charge is accumulated into the photodiode 12 in each pixel 11 of m-th line while the signal charge is read out from each pixel of another line.

Next, when the vertical scan pulse φVm is shifted to "H" level, the selection MOS transistor 13 of the unit pixel 11 of the m-th line is turned on, and the signal charge accumulated in the photodiode 12 flows into the selection MOS transistor 13. In this state, when the reset pulse φRn is set to "H" level, the reset MOS transistor 22 is turned on, and the vertical signal line 15 of n-th column is reset to the reference potential Vb of the column amplifier 19. The reset pulse φRn is shifted to "L" level, and then the horizontal scan pulse φHn is set to "H" level, whereby the horizontal selection MOS transistor 20 is turned on and the noise component is first output to the horizontal signal line 18 (period b).

Subsequently, when the read-out pulse φCn of the n-th column is shifted to "H" level, the read-out MOS transistor 14 of the unit pixel 11 of the n-th column is turned on, and the signal charge accumulated in the photodiode 12 is read out to the vertical signal line 15 of the n-th column through the selection MOS transistor 13 and the read-out MOS transistor 14 (period c).

Subsequently, by the feedback from the column amplifier 19 connected to the vertical signal line 15, the vertical signal line 15 is set to the reference potential Vb of the column amplifier 19, and the charge corresponding to the signal is read out to the capacitor 21 (period d). In a period e until the horizontal scan pulse φHn is shifted to "L" level by the shift of the read-out pulse φCn to "L" level, the signal component is output to the horizontal signal line 18. At the same time, the next charge accumulation is started in the photodiode 12.

Through a series of operations as described above, the successive outputs of the noise component (noise level) and the signal component (signal level) are transferred onto the horizontal signal line 18 through the same route (the column amplifier 19, the horizontal selection MOS transistor 29, etc.). This is further transferred through the horizontal output amplifier 25 to the CDS circuit 26, and noise cancel is performed by the correlated double sampling.

Figure 5:
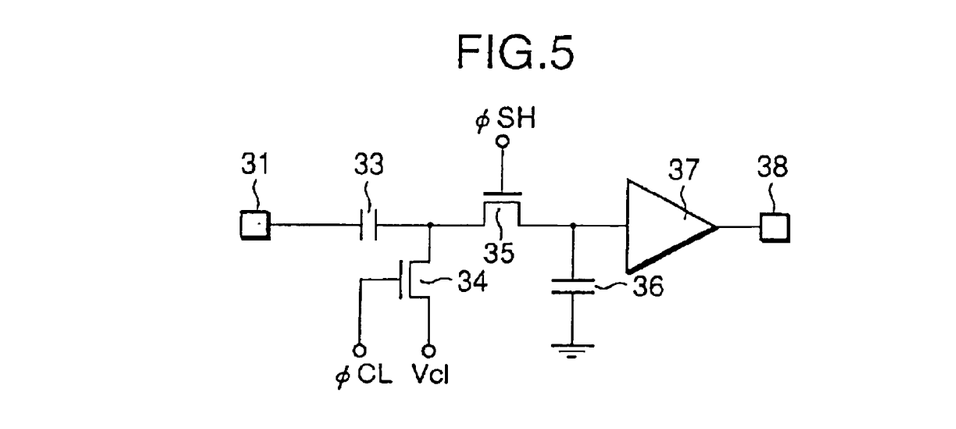
FIG. 5 is a circuit diagram showing an example of the construction of a CDS circuit.

FIG. 5 shows a specific circuit construction of the CDS circuit 26. The CDS circuit 26 comprises a clamp capacitor 33 connected to an input terminal 31 at one end thereof, a clamp MOS transistor 34 whose one main electrode is connected to the other end of the clamp capacitor 33, a sample hold MOS transistor 35 whose one main electrode is connected to the other end of the clamp capacitor 33, a sample hold capacitor 36 which is connected across the other main electrode of the sample hold MOS transistor 35 and the ground, and a buffer amplifier 37 which is connected across the other main electrode of the sample hold MOS transistor 35 and an output terminal 38.

In the CDS circuit 26, a clamp voltage Vcl is applied to the other main electrode of the clamp MOS transistor 34, and a clamp pulse φCL is applied to the gate electrode thereof. Further, a sample hold pulse φSH is applied to the gate electrode of the sample hold MOS transistor 35.

The CDS circuit 26 thus constructed is used as the differential circuit, and the correlated double sampling is performed by using the noise component and the signal component which are successively supplied, whereby the noise component contained in the signal component can be cancelled. Particularly, the reset and the signal are output through the same route to the horizontal signal line 18 in this order, and the successive outputs of the noise component and the signal component are obtained. Therefore, not only the Vth dispersion of the MOS transistor of the unit pixel 11, but also the reset noise (so-called kTC noise) causing the stripe-shaped fixed pattern noise can be suppressed.

Figure 3:
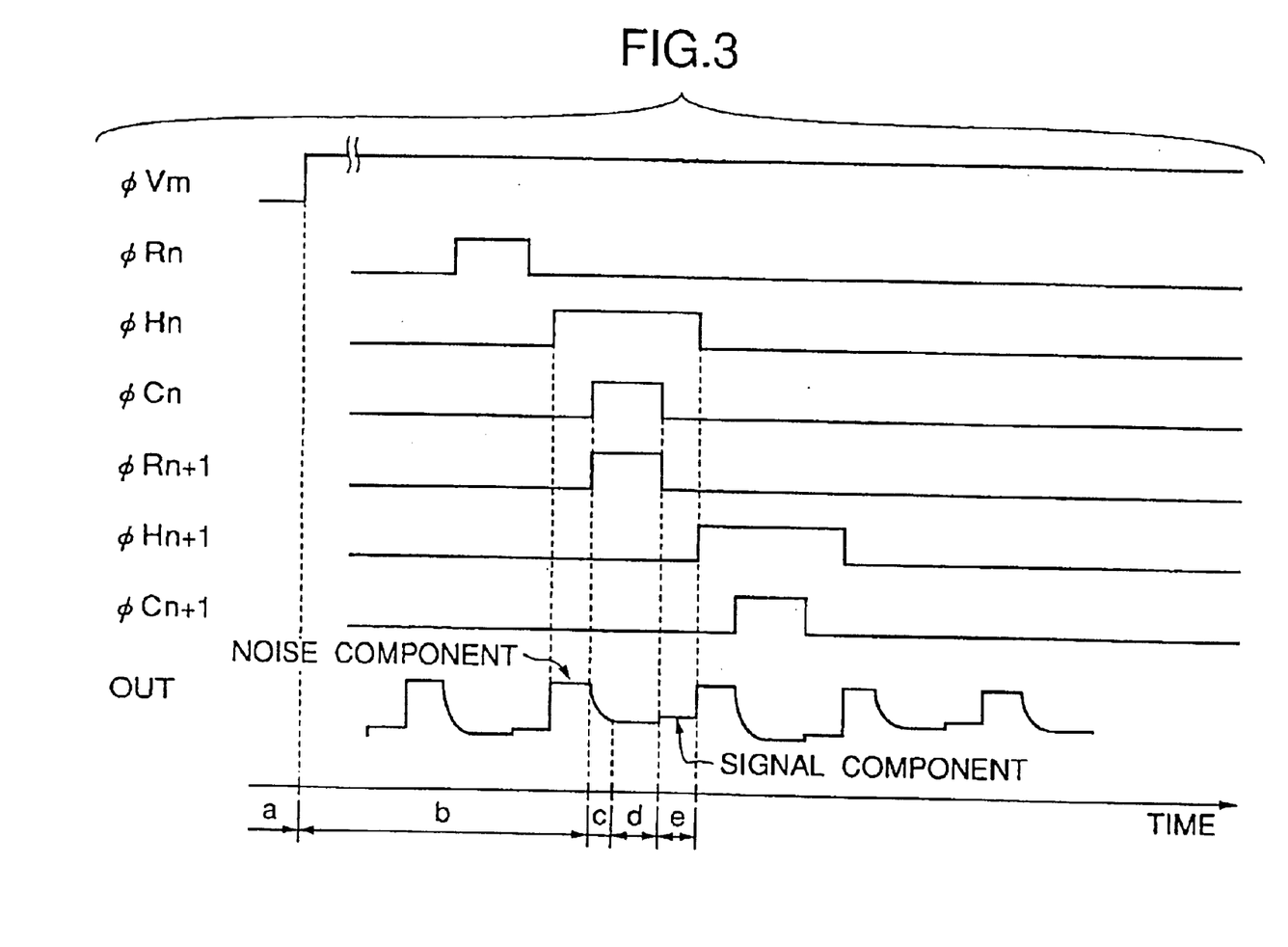
FIG. 3 is a timing chart showing the operation of the solid-state image pickup device according to the present invention.

As a modification of this embodiment, as is apparent from the timing chart of FIG. 3, the read-out pulse φCn of n-th column and the reset pulse φRn+1 of (n+1)-th column can be commonly used. Further, the same operation as described above can be also obtained at a timing at which the horizontal scan pulse φHn of n-th column and the reset pulse φRn+1 of (n+1)-th column are commonly used.

In the circuit performance, the same operation could be performed if the arrangement of the selection MOS transistor 13 and the read-out MOS transistor 14 is inverted. However, if the read-out MOS transistor 14 which repetitively turns on/off once every 1H (1 horizontal period) is disposed at the photodiode 12 side carrying out the charge accumulation, it causes occurrence of dark current. Accordingly, it is more preferable that the selection MOS transistor 13 is disposed at the side of the photodiode 12 as shown in FIG. 2 because the occurrence of the dark current can be suppressed.

Figure 6:
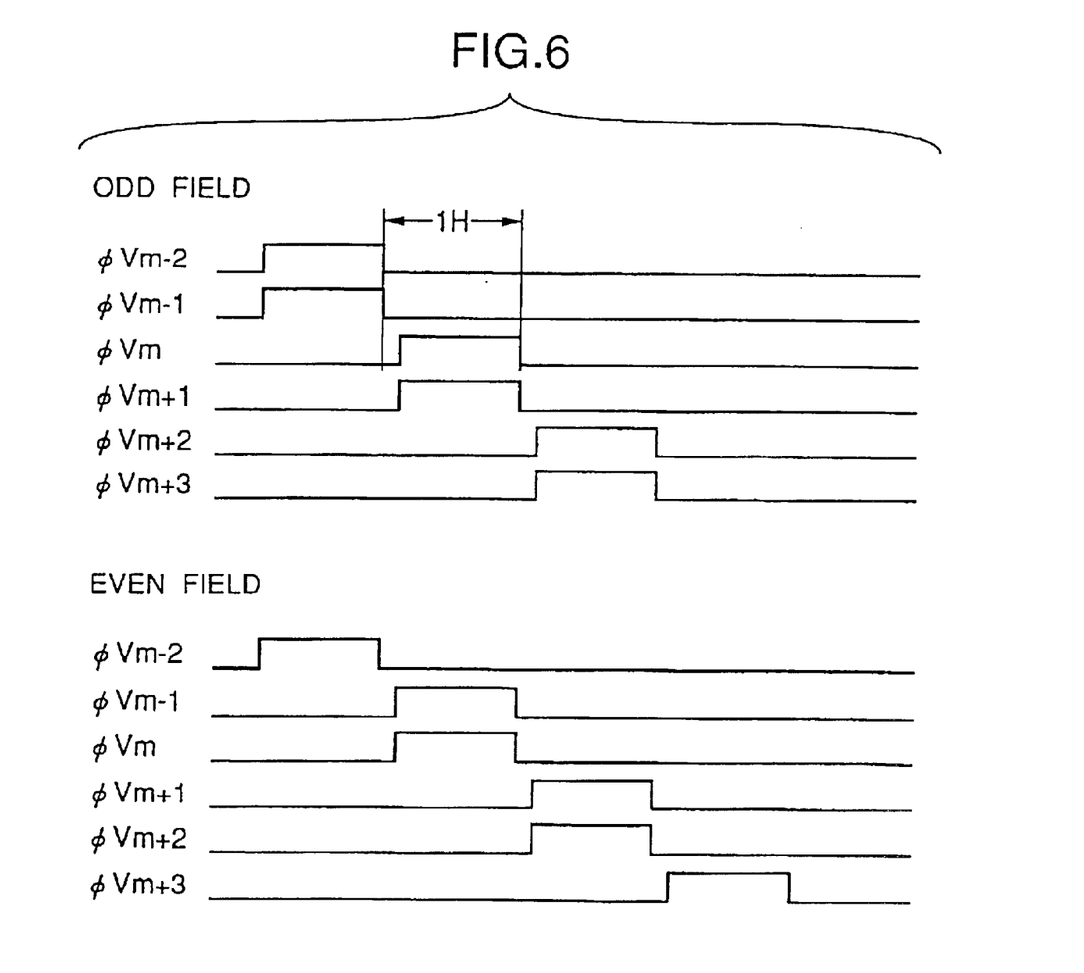
FIG. 6 is a timing chart when a field read-out operation is carried out.

Further, as shown in the timing chart of FIG. 6, the signal charges of two pixels in the vertical direction are added to each other on the vertical signal line 15 in the signal charge reading operation by driving the neighboring vertical selection lines two by two at the same time, and thus the field reading operation supporting the interlace can be implemented. Specifically, the vertical scan pulses φV are simultaneously generated in combination of φVm−2 and φVm−1, φVm and φVm+1, φVm+2 and φVm+3, . . . in the odd fields, and in combination of Vm−1 and φVm, φVm+1 and φVm+2, . . . in the even field.

In the above embodiment, each gate electrode 13a, 14a of the selection MOS transistor 13 and the read-out MOS transistor 14 has a one-layer gate structure, and thus this embodiment is simple in process and has a smaller number of steps, so that there is an advantage that the price is low.

Figure 4:
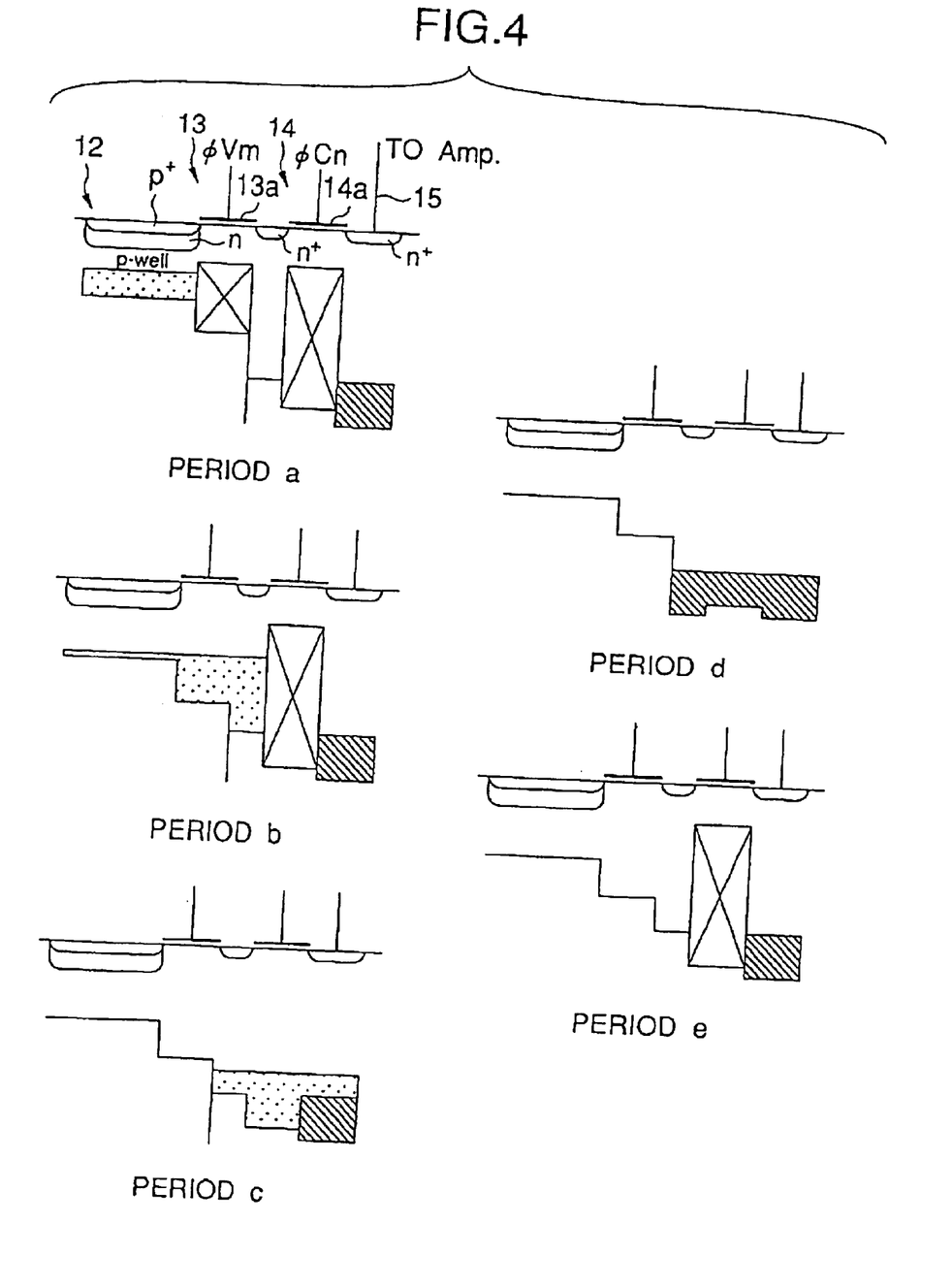
FIG. 4 is a potential diagram showing the operation of the solid-state image pickup device according to the first embodiment.

Conversely, as is apparent from FIG. 4, an n+ diffusion region is provided between the gate electrodes 13a, 14a, and thus there is a risk that at the shift timing from the period d to the period e, the noise component due to the dispersion of field through occurring in the gate electrode 14a of the read-out MOS transistor 14 remains. Further, there is also a risk that overflow charges occurring in pixels of a line which is not selected invade between the selection MOS transistor 13 and the read-out MOS transistor 14, so that smear occurs.

Figure 7:
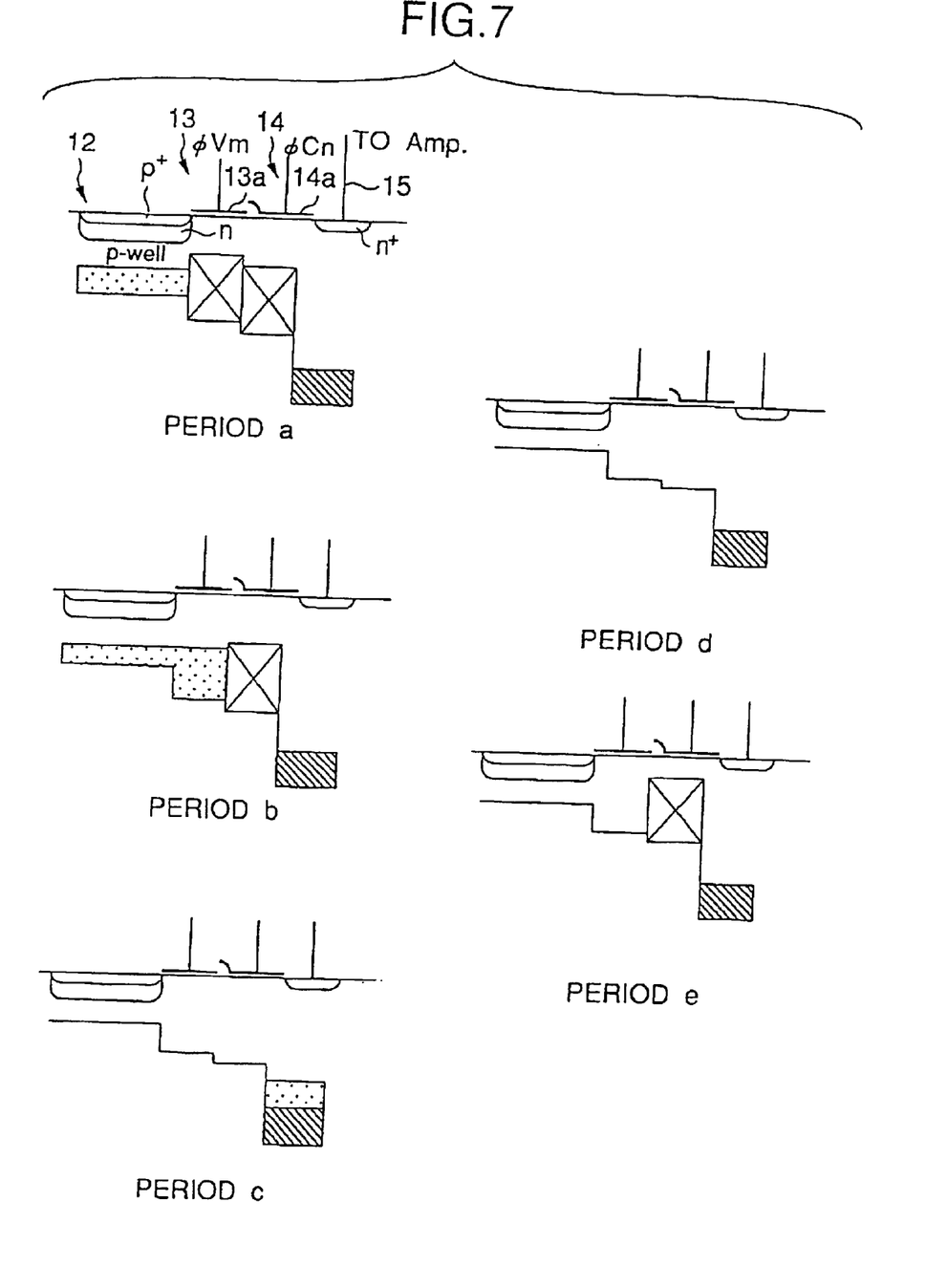
FIG. 7 is a potential diagram showing the operation of a modification of the solid-state image pickup device according to the first embodiment.

Therefore, in the solid-state image pickup device according to the modification of the first embodiment shown in the potential diagram of FIG. 7, each of the gate electrodes 13a, 14a of the selection MOS transistor 13 and the read-out MOS transistor 14 is designed in a double gate structure comprising a two-layer gate electrode, and the neighboring portions are overlapped with each other. In the same figure, the period a to the period e represent the potential state of the period a to the period e in the timing chart of FIG. 3, and the basic operation is the same as FIG. 4.

As described above, the neighboring portions of the gate electrodes 13a, 14a of the selection MOS transistor 13 and the read-out MOS transistor 14 are overlapped with each other, whereby the n+ diffusion region shown in FIG. 4 does not occur between the gate electrodes 13a, 14a, so that the noise component due to the dispersion of the field occurring in the gate electrode 14a of the read-out MOS transistor 14 at the shift timing from the period d to the period e can be also completely transformed.

Accordingly, any noise due to the gate electrode 14a of the read-out MOS transistor 14 does not occur. Further, the overflow charge from the photodiode 12 is directly supplied to the n+ diffusion region connected to the vertical signal line 15, so that the smear can be suppressed to only the charges occurring within the one pixel read-out time by resetting the vertical signal line 15 just before the signal charge (pixel signal) is read out.

Figure 8:
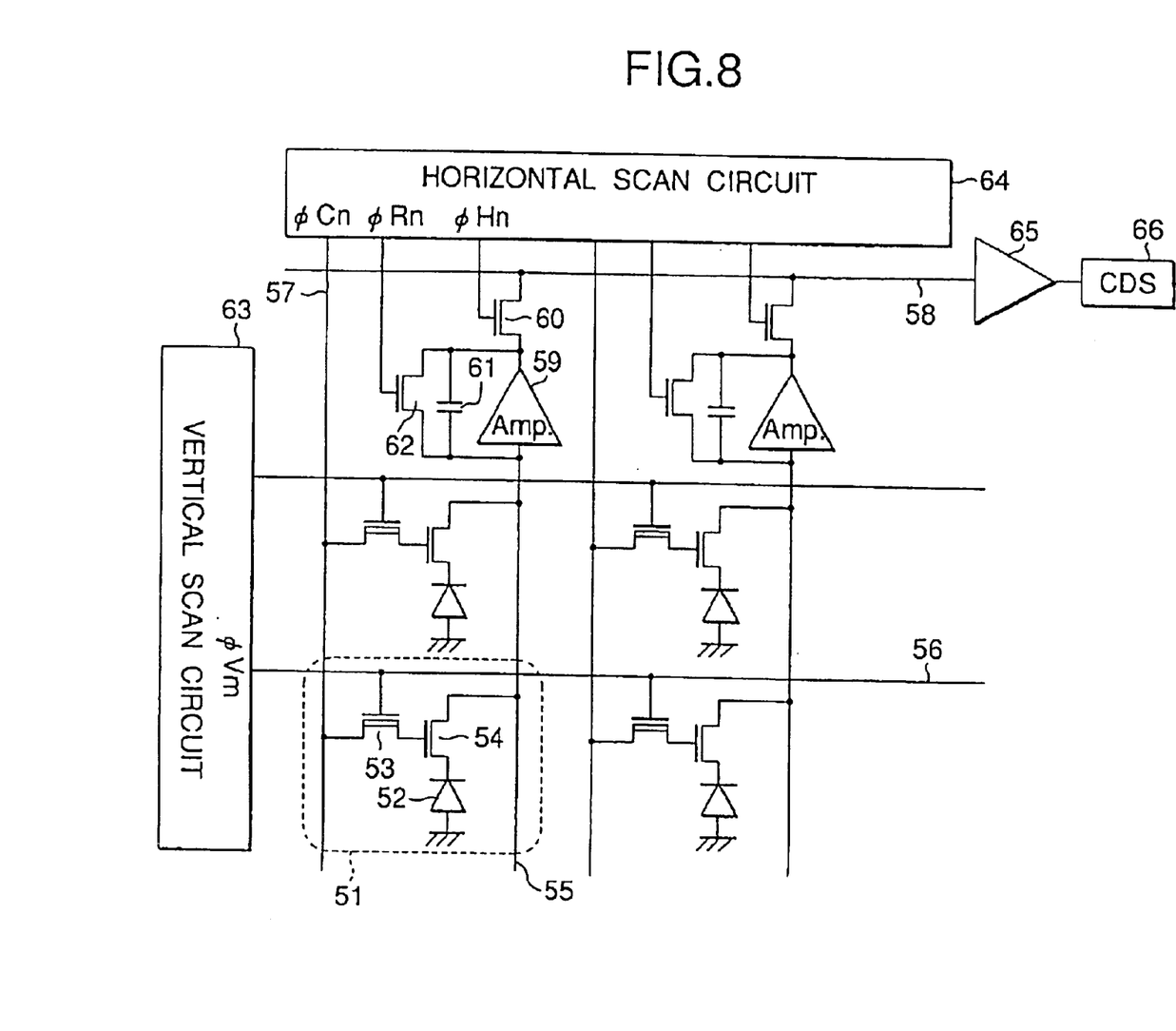
FIG. 8 is a schematic diagram showing a second embodiment of the solid-state image pickup device according to the present invention.

FIG. 8 is a schematic diagram showing a second embodiment of the solid-state image pickup device according to the present invention. In FIG. 8, an area surrounded by a broken line represents a unit pixel 51. As in the case of the first embodiment, the unit pixel 51 includes a photodiode (PD) 52 serving as a photoelectrically transducing element, a selection MOS transistor 53 serving as a selection switch for selecting a pixel, and a read-out MOS transistor 54 serving as a read-out switch for reading signal charge from the photodiode 52, and they are two-dimensionally arranged in a matrix form.

In the unit pixel 51, the read-out MOS transistor 54 is connected across the cathode electrode of the photodiode 52 and the vertical signal line 55. Further, the selection MOS transistor 53 is connected across the gate electrode of the read-out MOS transistor 54 and the read-out pulse line 57. For example, a depression type is used for the selection MOS transistor 53. The gate electrode of the selection MOS transistor 53 is connected to the vertical selection line 56.

A column amplifier 59 for converting the signal charge read out to the vertical signal line 55 to a voltage signal and a horizontal selection MOS transistor 60 for selectively outputting the output voltage of the column amplifier 59 to the horizontal signal line 58 are connected to each other in series between the vertical signal line 55 and the horizontal signal line 58. A capacitor 61 and a reset MOS transistor 62 for resetting the vertical signal line 55 are connected in parallel to the column amplifier 59.

Further, a vertical scan circuit 63 for line selection and a horizontal scan circuit 64 for column selection are provided. Each of these scan circuits 63 and 64 comprises a shift register, for example. The vertical scan pulse ΦVm output from the vertical scan circuit 63 is applied to the vertical selection line 56, the read-out pulse ΦCn output from the horizontal scan circuit 64 is applied to the read-out pulse line 57, a horizontal scan pulse ΦHn is applied to the gate electrode of the horizontal selection MOS transistor 60, and a reset pulse ΦRn is applied to the gate electrode of the reset MOS transistor 62. A CDS circuit 66 having the circuit construction shown in FIG. 5 is provided as a differential circuit through a horizontal output amplifier 65.

Figure 9:
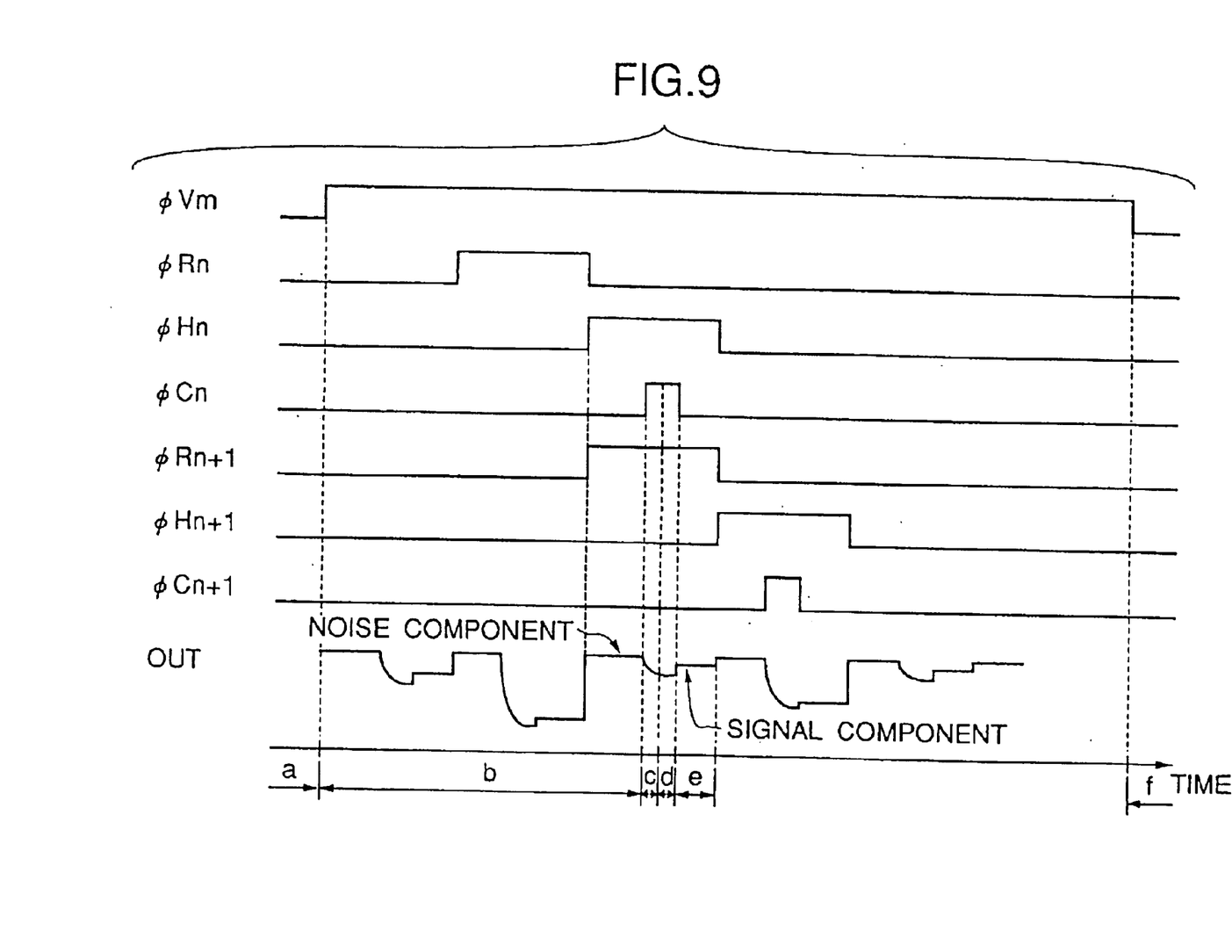
FIG. 9 is a timing chart showing the operation of the solid-state image pickup device according to the second embodiment.

Next, the operation of the solid-state image pickup device according to the second embodiment thus constructed will be described with reference to the potential diagrams of FIGS. 10 and 11 by using the timing chart of FIG. 9.

Figure 10:
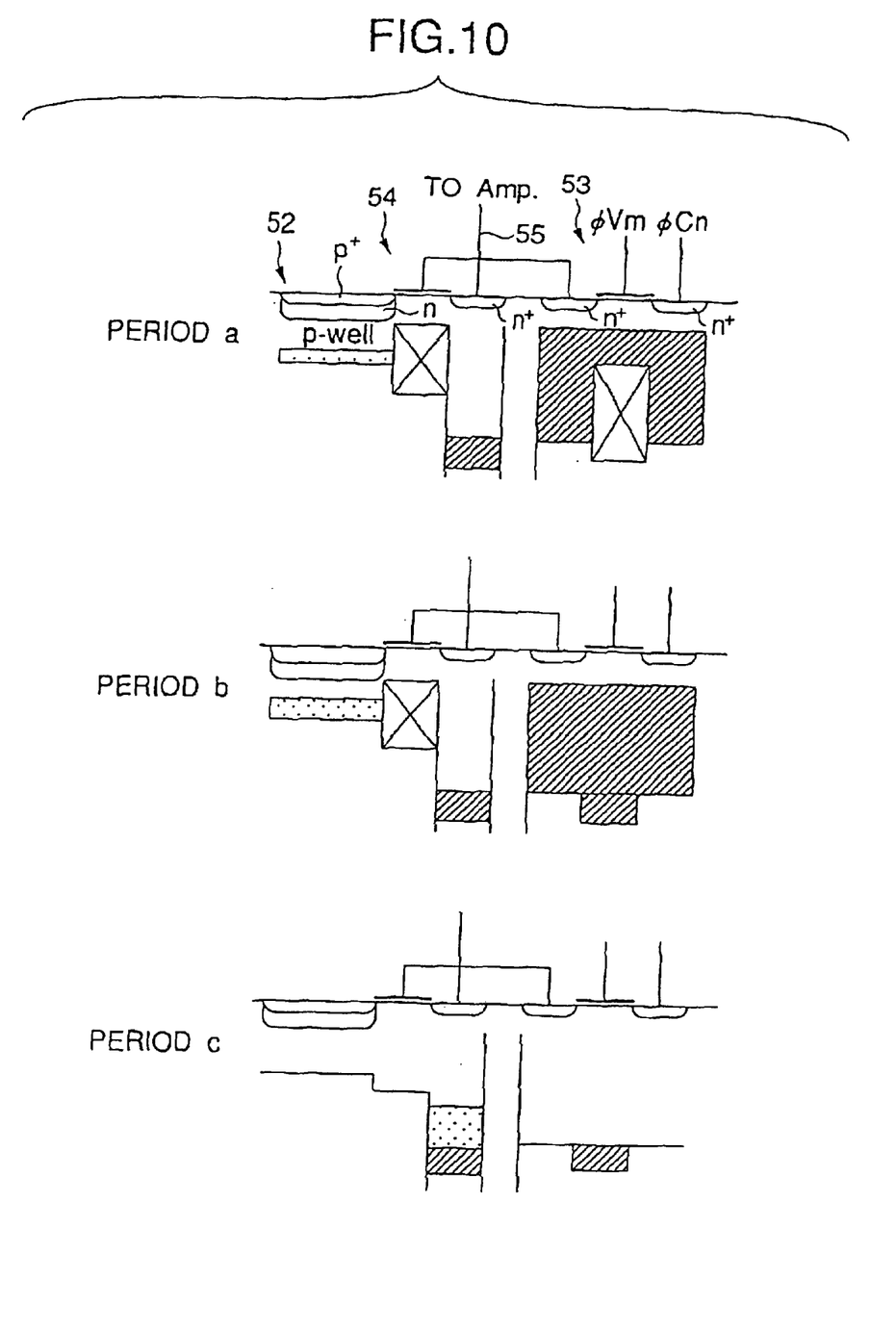
FIG. 10 is a potential diagram (part 1) showing the operation of the solid-state image pickup device according to the second embodiment.
Figure 11:
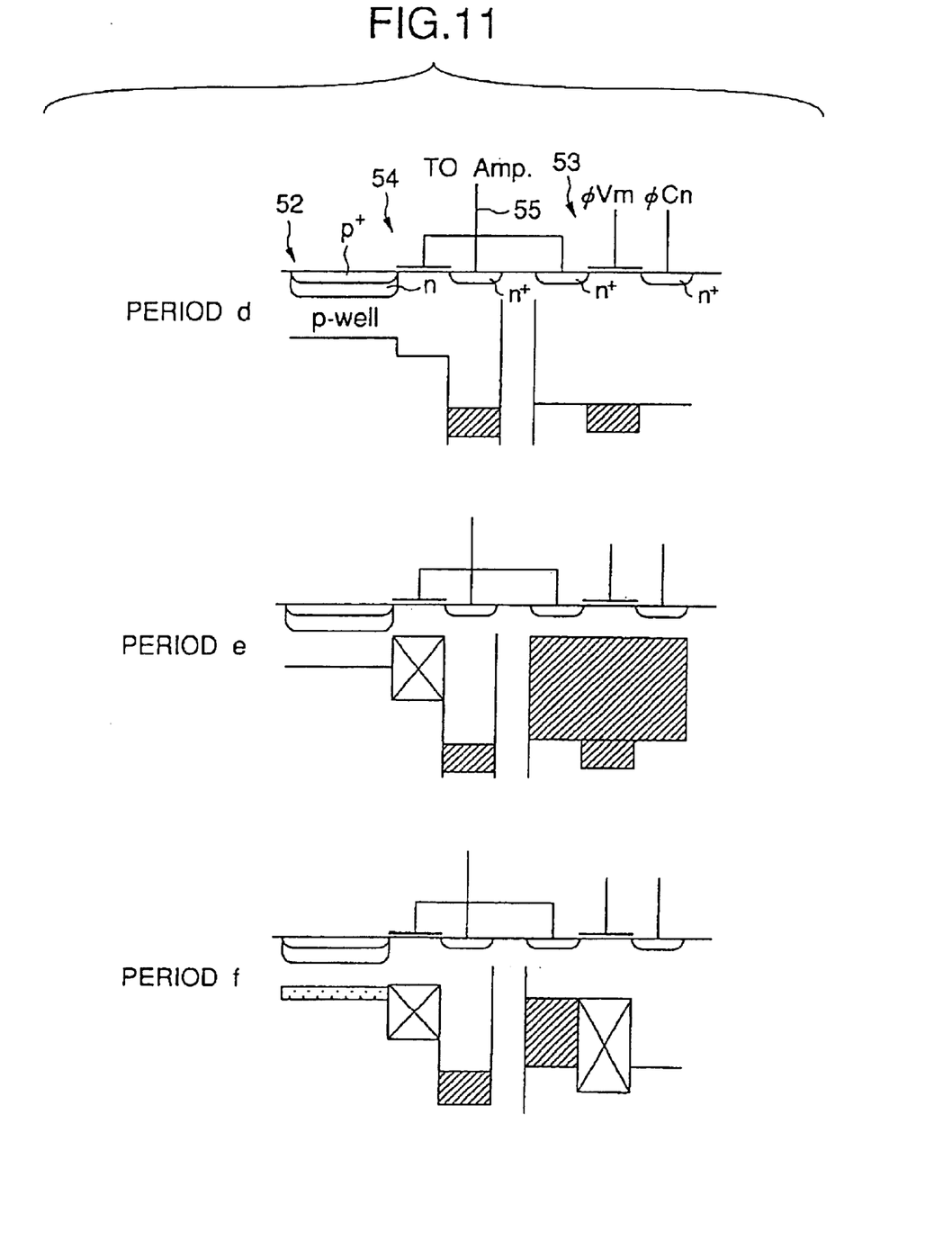
FIG. 11 is a potential diagram (part 2) showing the operation of the solid-state image pickup device according to the second embodiment.

As is apparent from FIGS. 10 and 11, the photodiode 52 has an HAD sensor construction in which a hole accumulation structure formed of a p+ layer is added to the surface side of an np diode.

First, during the period a when the vertical scan pulse φVm of m-th line is in "L" level, the signal charge is accumulated in the photodiode 52 of each of the pixels 51 of m-th line while the signal charge is read out from the pixels of the other lines.

Subsequently, when the vertical scan pulse ΦVm is shifted to "H" level, the selection MOS transistor 53 of the unit pixel 51 of m-th line is turned on. When the reset pulse ΦRn is set to "H" level in this state, the reset MOS transistor 62 is turned on, and the vertical signal line 55 of n-th column is reset to the reference potential Vb of the column amplifier 59. Thereafter, when the reset pulse φRn is shifted to "L" level and at the same time the horizontal scan pulse ΦHn is set to "H" level, the horizontal selection MOS transistor 60 is turned on, and the noise component is first output to the horizontal signal line 58 (period b).

Subsequently, when the read-out pulse φCn of n-th column is shifted to. "H" level, the read-out pulse φCn is applied to the gate electrode of the read-out MOS transistor 54 through the selection MOS transistor 53 which has been in ON state, whereby the signal charge accumulated in the photodiode 52 is read out through the read-out MOS transistor 54 to the vertical signal line 55 of n-th column (period c).

Subsequently, by the feedback from the column amplifier 59 connected to the vertical signal line 55, the vertical signal line 55 is set to the reference potential Vb of the column amplifier 59, and the charge corresponding to the signal is read out to the capacitor 61 (period d). Thereafter, when the read-out pulse φCn is shifted to "L" level, the signal component is output to the horizontal signal line 58 in the period e until the horizontal scan pulse φHn is shifted to "L" level. At the same time, the next charge accumulation is started in the photodiode 62.

Through a series of operations as described above, as in the case of the first embodiment, the successive output of the noise component (noise level) and the signal component (signal level) is obtained on the horizontal signal line 58, and it is further transferred to the CDS circuit 66 through the horizontal output amplifier 65 in which the noise cancel is performed by the correlated double sampling.

Particularly in this embodiment, the read-out pulse φCn is supplied to the gate electrode of the read-out MOS transistor 54 through the source/drain of the selection MOS transistor, so that occurrence of kTC noise of the selection MOS transistor 53 and the read-out MOS transistor 54 can be suppressed. In this case, each of the gate electrodes of the selection MOS transistor 53 and the read-out MOS transistor 54 can be constructed by one-layer gate electrode. Therefore, there are obtained advantages that the process is simple, the number of steps is small and the price is low.

Further, the depression type MOS transistor is used as the selection MOS transistor 53, and thus the following advantages can be obtained.

(1) 0 V is applied to the gate electrode of the read-out MOS transistor 54 at the timing of the period a of FIG. 10 once every 1H. On the other hand, in the case where a normal enhancement type MOS transistor is used, the selection MOS transistor 53 is turned off as shown in the period a of FIG. 12, and thus 0 V is not applied to the gate electrode of the read-out MOS transistor 54. Accordingly, the potential of the read-out MOS transistor 54 must be held for one field period. However, when an inverse bias leak current or light leakage is great, the potential of the gate cannot be held, and it is varied during the period of one field.

(2) By matching the potential of the read-out MOS transistor 54, a plus potential is applied to the gate electrode of the read-out MOS transistor 54 at the timing of the period f of FIG. 11 by using the depression type for the selection MOS transistor 53 although the read-out MOS transistor 54 is an enhancement type, and the overflow operation can be performed. As a result, blooming can be suppressed.

In this embodiment, the depression type MOS transistor is used as the selection MOS transistor 53, however, it is not limited to the depression type. Even when the enhancement type is used, the effect inherent to the embodiment described above can be obtained although the effect inherent to the depression type as described above cannot be obtained.

Figure 12:
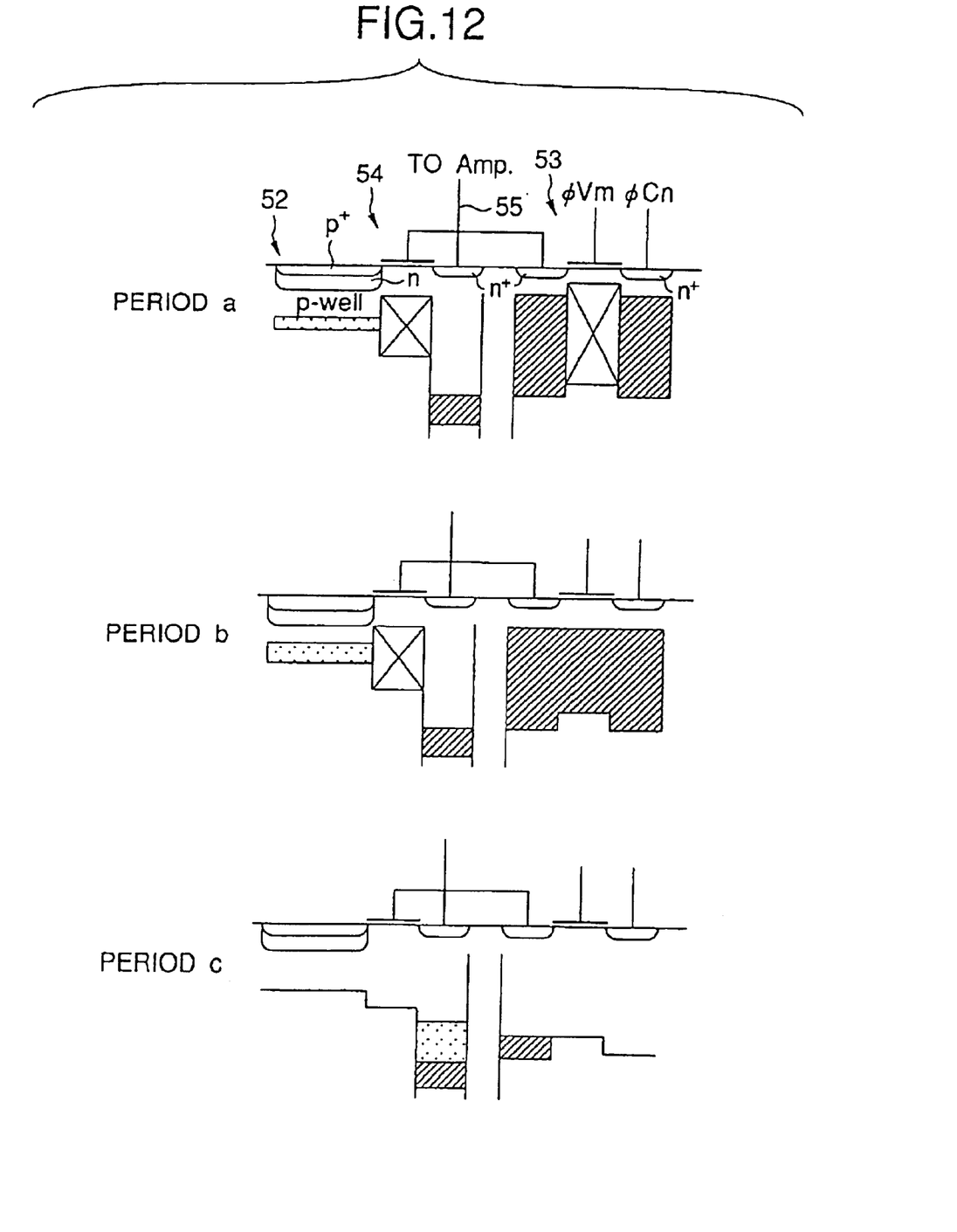
FIG. 12 is a potential diagram (part 1) showing a modification of the solid-state image pickup device according to the second embodiment.
Figure 13:
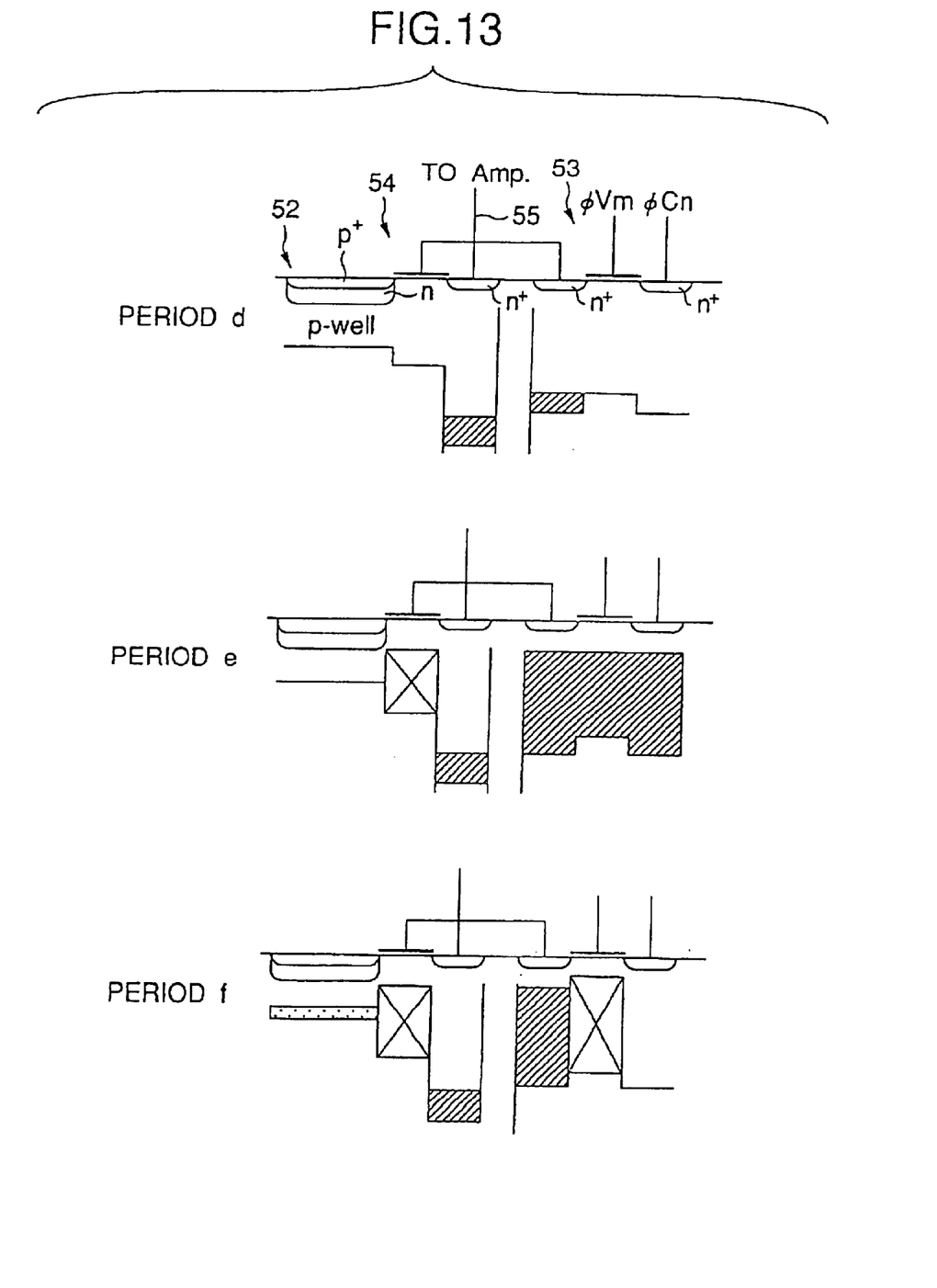
FIG. 13 is a potential diagram (part 2) of the modification of the solid-state image pickup device according to the second embodiment.

FIGS. 12 and 13 are potential diagrams when an enhancement type MOS transistor is used as the selection MOS transistor 53.

In the case of the solid-state image pickup device of the second embodiment, the field read-out operation supporting the interlace can be implemented by simultaneously driving the neighboring vertical selection signals two by two as shown in the timing chart of FIG. 6 as in the case of the solid-state image pickup device according to the first embodiment.

Figure 14:
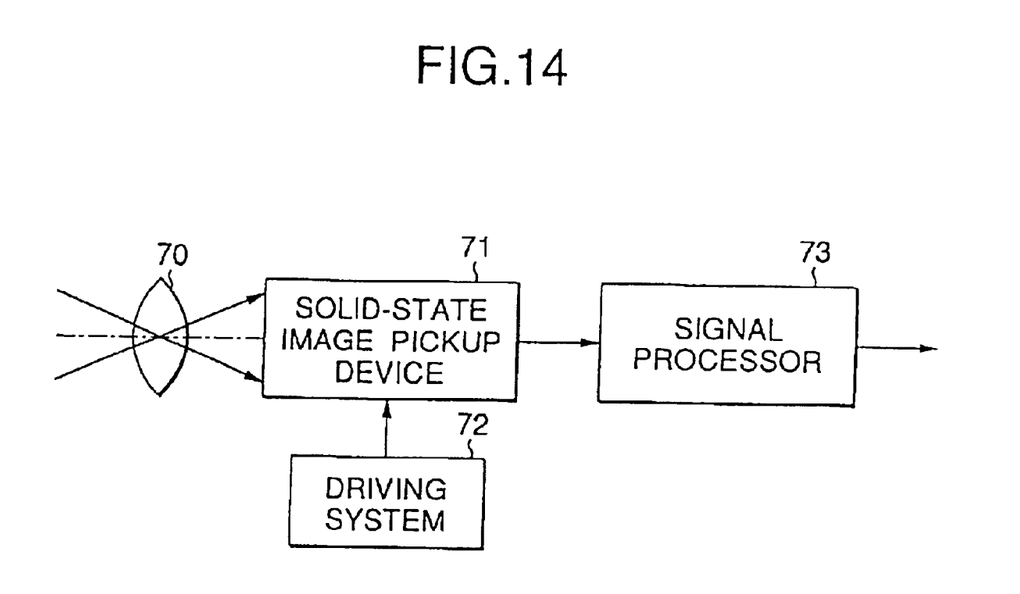
FIG. 14 is a diagram showing a camera to which the solid-state image pickup device and the driving method thereof according to the present invention is applied.

FIG. 14 is a diagram showing a camera to which the solid-state image pickup device and the driving method thereof as described above are applied. In FIG. 14, incident light from a subject is focused onto the image pickup face of the solid-state image pickup device 71 by an optical system containing a lens 70. One of the solid-state image pickup devices as described above may be used as the solid-state image pickup device 71. The solid-state image pickup device 71 is driven according to the above-described driving method by a driving system 72 containing a timing generator. The output signal of the solid-state image pickup device is subjected to various signal processing by a signal processor 73 to obtain video signals.

As described above, according to the present invention, in the solid-state image pickup device in which the column amplifier is connected to each vertical signal line, the signal of each pixel can be read out on a pixel basis, the vertical signal line is first reset and then a pixel signal is read out to the vertical signal line from the photoelectrically transducing element to thereby successively output the reset level and then the signal level to the same route, and thereafter the difference between the reset level and the signal level is calculated. Therefore, the fixed pattern noise due to the characteristic dispersion of each unit pixel and the stripe-shaped fixed pattern noise having correlation in the vertical direction can be suppressed in the device, so that it can contribute to reduction of the scale of the camera system in the above-described camera using the solid-state image pickup device as an image pickup device.

What is claimed is:

1. A solid-state image pickup device, comprising:

a pixel portion having unit pixels arranged two-dimensionally in a matrix form, each of said unit pixels including a photoelectrically transducing element for photoelectrically transducing incident light to obtain a signal charge, and stocking the signal charge thus obtained, a selection switch for selecting one of the pixels, and a read-out switch for reading out the signal charge from said photoelectrically transducing element to one of a plurality of vertical signal lines;

a plurality of amplifying means, at least one of the amplifying means being connected to each of said respective vertical signal lines and for converting the signal charge read out to the vertical signal lines to an electrical signal; and a plurality of reset means for resetting each of said vertical signal lines;

wherein each of said selection switch and said read-out switch comprises a MOS transistor having a double gate structure, wherein each gate electrode of said selection switch and said read-out switch comprises a two-layer gate electrode, and neighboring portions are overlapped with each other, and wherein the gate electrode of one of the selection switch and the read-out switch is connected to one of a plurality of vertical scan lines and the gate electrode of the other of the selection switch and the read-out switch is connected to one of a plurality of read-out pulse horizontal signal lines.

2. The solid-state image pickup device as claimed in claim 1, wherein said photoelectrically transducing element comprises a photodiode having a HAD sensor structure.

3. The solid-state image pickup device as claimed in claim 1, wherein each of said reset means resets the respective vertical signal line in synchronism with a read-out timing before one pixel is read or a horizontal scan timing begins.

4. The solid-state image pickup device as claimed in claim 1, wherein each of said reset means resets the vertical signal line just before the signal charge is read out from said photoelectrically transducing element.

5. The solid-state image pickup device as claimed in claim 1, wherein said selection switch and said read-out switch are connected to each other in series between said photoelectrically transducing element and said vertical signal line.

6. The solid-state image pickup device as claimed in claim 5, wherein said selection switch is disposed at said photoelectrically transducing element side.

7. The solid-state image pickup device as claimed in claim 1, wherein a horizontal selection switch for commonly outputting a reset level on said vertical signal line at a reset time of said reset means and a signal level read out onto said vertical signal line after the reset is provided between said vertical signal line and a horizontal signal line.

8. The solid-state image pickup device as claimed in claim 7, further including a differential circuit for calculating the difference between the reset level successively output by said horizontal selection switch and the signal level.

9. The solid-state image pickup device as claimed in claim 8, wherein said differential circuit comprises a correlation double sampling circuit.

10. A method of driving a solid-state image pickup device comprising a pixel portion having unit pixels arranged two-dimensionally in a matrix form, each of said unit pixels including a photoelectrically transducing element for photoelectrically transducing incident light to obtain a signal charge and stocking the signal charge thus obtained, a selection switch for selecting one of the pixels, and a read-out switch for reading out the signal charge from said photoelectrically transducing element to one of a plurality of vertical signal lines; a plurality of amplifying means at least one of which are connected to each of said respective vertical signal lines and for converting the signal charge read out to the vertical signal lines to an electrical signal, and a plurality of reset means for resetting each of said vertical signal lines, the method comprising the steps of:

resetting the vertical signal line;

after resetting the vertical signal line, reading out a pixel signal from said photoelectrically transducing element to the vertical signal line to successively output a reset level and a signal level in this order through the same route; and after reading out the pixel signal, calculating a difference between the reset level and the signal level, wherein each of said selection switch and said read-out switch comprises a MOS transistor having a double gate structure, wherein each gate electrode of said selection switch and said read-out switch comprises a two-layer gate electrode, and neighboring portions are overlapped with each other, and wherein the gate electrode of one of the selection switch and the read-out switch is connected to one of a plurality of vertical selection lines and the gate electrode of the other of the selection switch and the read-out switch is connected to one of a plurality of read-out pulse lines.

11. The solid-state image pickup device driving method as claimed in claim 10, wherein the solid-state image pickup device comprises the plurality of vertical selection lines, and wherein neighboring vertical selection lines are simultaneously driven two by two in turn, and signal charges of two pixels in a vertical direction are mixed with each other on the vertical signal line.

12. A camera comprising:

an optical system for focusing incident light from a subject onto a solid-state image pickup device;

a driving system for driving said solid-state image pickup device; and a signal processing system for processing an output signal of said solid-state image pickup device, wherein said solid-state image pickup device comprises a pixel portion having unit pixels arranged two-dimensionally in a matrix form, each of said unit pixels including a photoelectrically transducing element for photoelectrically transducing incident light to obtain signal charge, and stocking the signal charge thus obtained, a selection switch for selecting one of the pixels, and a read-out switch for reading out the signal charge from said photoelectrically transducing element to one of a plurality of vertical signal lines, a plurality of means, at least one of which are connected to each of said respective vertical signal lines and for converting the signal charge read out to the vertical signal lines to an electrical signal, and a plurality of reset means for resetting each of said vertical signal lines, and wherein said driving system drives said solid-state image pickup device so that one of the vertical signal lines is first reset and then a pixel signal is read out from said photoelectrically transducing element to the vertical signal line to successively output a reset level and a signal level in this order through the same route, and thereafter calculates a difference between the reset level and the signal level, and wherein each of said selection switch and said read-out switch comprises a MOS transistor having a double gate structure, wherein each gate electrode of said selection switch and said read-out switch comprises a two-layer gate electrode, and neighboring portions are overlapped with each other, and wherein the gate electrode of one of the selection switch and the read-out switch is connected to one of a plurality of vertical selection lines and the gate electrode of the other of the selection switch and the read-out switch is connected to one of a plurality of read-out pulse lines.

13. The camera as claimed in claim 12, wherein the solid-state image pickup device comprises the plurality of vertical selection lines, and wherein neighboring vertical selection lines of said solid-state image pickup device are simultaneously driven two by two in turn, and signal charges of two pixels in a vertical direction are mixed with each other on the vertical signal line to perform an interlace-supporting feedback read-out operation.

* * * * *